US012772858B2

(12) United States Patent
Divakaran et al.

(10) Patent No.: US 12,772,858 B2

(45) Date of Patent: Oct. 20, 2026

(54) SEMICONDUCTOR DEVICE WITH IMPROVED ESD PERFORMANCE, ESD RELIABILITY AND SUBSTRATE EMBEDDED POWERGRID APPROACH

(71) Applicant: SAMSUNG ELECTRONICS CO., LTD., Suwon-si (KR)

(72) Inventors: Aruldas Divakaran, Bengaluru (IN); Subramanian Narasimhamoorthy, Bengaluru (IN); Mallikarjungouda S Patil, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 724 days.

(21) Appl. No.: 17/950,175

(22) Filed: Sep. 22, 2022

(65) Prior Publication Data

US 2024/0030162 A1 Jan. 25, 2024

(30) Foreign Application Priority Data

Jul. 25, 2022 (IN) ............................. 202241042463

(51) Int. Cl.

| | |
|---|---|
| ***H10W 42/60*** | (2026.01) |
| ***H10W 20/20*** | (2026.01) |
| ***H10W 20/41*** | (2026.01) |
| ***H10W 40/22*** | (2026.01) |

(52) U.S. Cl.

CPC ........... *H10W 42/60* (2026.01); *H10W 20/20* (2026.01); *H10W 20/427* (2026.01); *H10W 40/228* (2026.01)

(58) Field of Classification Search

CPC ... H01L 23/60; H01L 23/3677; H01L 23/481; H01L 23/5286; H01L 23/5222; H01L 23/4334; H01L 23/535; H01L 23/36; H01L 23/5223; H01L 23/5226; H01L 23/5283; H10D 89/931; H10D 89/921; H10D 89/60; H10D 89/10

See application file for complete search history.

(56) References Cited

U.S. PATENT DOCUMENTS

| | | | |
|---|---|---|---|
| 5,424,245 | A | 6/1995 | Gurtler et al. |
| 6,057,188 | A | 5/2000 | El-Kareh et al. |
| 8,114,753 | B2 | 2/2012 | El-Kareh |
| 8,232,625 | B2 | 7/2012 | Voldman |
| 9,570,395 | B1 | 2/2017 | Sengupta et al. |
| 10,636,739 | B2 | 4/2020 | Beyne et al. |
| 2012/0069478 | A1 | 3/2012 | Caplan et al. |
| 2018/0374791 | A1 | 12/2018 | Smith et al. |

(Continued)

FOREIGN PATENT DOCUMENTS

| | | |
|---|---|---|
| CN | 108054157 B | 1/2021 |
| WO | WO 2017/091155 A1 | 6/2017 |

OTHER PUBLICATIONS

Prasad et al., IEEE IEDM, Dec. 7-11, 2019.

*Primary Examiner* — Jeff W Natalini
*Assistant Examiner* — Nicholas Leland Hutson
(74) *Attorney, Agent, or Firm* — Muir Patent Law, PLLC

(57) ABSTRACT

A semiconductor device includes a substrate, a plurality of metal rails embedded in the substrate, and a power grid embedded in the substrate, at least one of the plurality of metal rails being part of the power grid and being directly connected to the substrate to control an Electrostatic Discharge (ESD) in the semiconductor device.

20 Claims, 16 Drawing Sheets

(56) References Cited

U.S. PATENT DOCUMENTS

| | | | | |
|---|---|---|---|---|
| 2019/0213298 | A1* | 7/2019 | Correale, Jr. | H01L 23/5286 |
| 2021/0305079 | A1* | 9/2021 | Or-Bach | G11C 5/025 |
| 2022/0293513 | A1* | 9/2022 | Li | H02J 50/05 |
| 2022/0415742 | A1* | 12/2022 | Sahu | H01L 23/345 |
| 2023/0068882 | A1* | 3/2023 | Hsu | H10D 89/921 |
| 2023/0102133 | A1* | 3/2023 | Ostermayr | H01L 24/64<br>257/531 |
| 2023/0178478 | A1* | 6/2023 | Hiblot | H01L 21/743<br>257/774 |

* cited by examiner

SEMICONDUCTOR DEVICE WITH IMPROVED ESD PERFORMANCE, ESD RELIABILITY AND SUBSTRATE EMBEDDED POWERGRID APPROACH

CROSS-REFERENCE TO RELATED APPLICATION

This application is based on and claims priority under 35 U.S.C. § 119 to Indian Patent Application No. 202241042463, filed on Jul. 25, 2022, in the Indian Intellectual Property Office, the disclosure of which is incorporated by reference herein in its entirety.

BACKGROUND

1. Field

The present disclosure relates to a semiconductor device. More particularly, the present disclosure relates to a semiconductor device with an improved Electrostatic Discharge (ESD) performance and reliability and high density routing with improved signal integrity using substrate embedded power distribution network (PDN) or a power grid with substrate embedded decoupling capacitors.

2. Description of the Related Art

In a Very Large-Scale Integration (VLSI), semiconductor device scaling has enabled fabrication of high speed devices and low power chips. Since a size of the semiconductor devices has become smaller, their capability to handle high current stress during an ESD event has also decreased.

SUMMARY

An aspect of embodiments provides a semiconductor device, including a substrate, a plurality of metal rails embedded in the substrate, and a power grid embedded in the substrate, at least one of the plurality of metal rails being part of the power grid and being directly connected to the substrate to control an Electrostatic Discharge (ESD) in the semiconductor device.

Another aspect of embodiments provides a semiconductor device, including a substrate, at least one Power Distribution Network (PDN) layer embedded in the substrate, the at least one PDN layer being a single layer and including a power line, a ground line, and a high-k dielectric part between the power line and the ground, and a standard cell embedded in the substrate, the standard cell being between portions of the at least one PDN layer.

Another aspect of embodiments provides a semiconductor device, including at least one top Power Distribution Network (PDN) layer embedded in the substrate, the at least one top PDN layer including a first power line, a first ground line, and a first high-k dielectric part between the first power line and the first ground line, at least one bottom PDN layer embedded in the substrate, the at least one bottom PDN layer including a second power line, a second ground line, and a second high-k dielectric part between the second power line and the second ground line, and at least one standard cell embedded between portions of the at least one top PDN layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
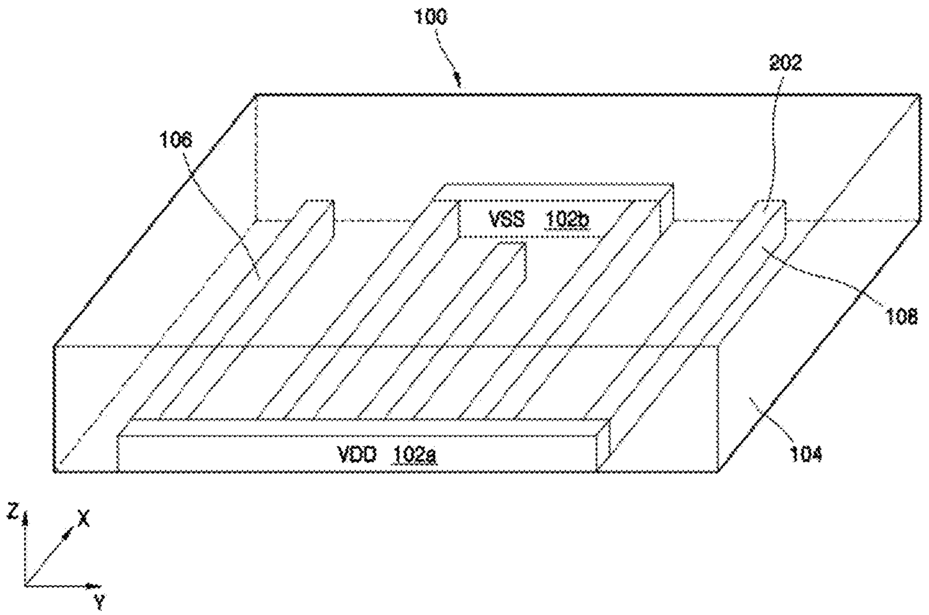
FIG. 1 is a schematic diagram of a power grid with a single metal layer embedded inside a substrate of a semiconductor device, according to example embodiments.

Example embodiments herein provide a semiconductor device that includes a plurality of metal rails, a substrate, and at least one power grid. The at least one power grid is embedded inside the substrate, and at least one metal rail from the plurality of metal rails may be directly connected to and embedded in the substrate to control an electrostatic discharge (ESD) in the semiconductor device.

In detail, in the semiconductor device, a metal capacitor may be formed by an already existing power grid embedded in the substrate. A large distributed capacitance may be achieved by taking advantage of a large metal area in the power grid. An efficient grounding through a ground rail may be achieved. Either silicon dioxide ($SiO_2$) or a high-k material may be used as a dielectric between power and ground rails that are embedded in the substrate. Additionally, the substrate may be also used as a ground plate, thereby providing large decoupling capacitance in the power supply line without any additional area cost.

For example, in 4 nm nodes, self-heating may cause electromagnetic (EM) issues in the back end metals due to reduced current capability. Self-heating may also degrade performance of active devices. Therefore, a metal stack on a bottom of a power grid may increase dissipation of heat into the substrate, as well as minimize heat conducted into the metals, e.g., wires, carrying signals, which are on a top side of the device. In other words, a metal stack for a power grid buried in the substrate may act as an efficient heat sink.

The proposed semiconductor device arrangement improves the ESD performance by directly connecting to low resistive metal rails embedded in the substrate and the substrate embedded power grid approach with integrated distributed decoupling capacitances for high signal integrity and high density routing for power performance area (PPA) benefit for advanced nodes in the semiconductor device. The proposed semiconductor device arrangement reduces the resistance of the entire metal stack from a top metal in a metal stack to metals connecting the semiconductor devices.

The proposed semiconductor device improves the ESD performance of chips by reducing the resistance in the ESD path. The proposed semiconductor device arrangement optimizes an entire metal stack by selectively or fully embedding entire power and ground rails within a substrate, e.g., as opposed to maintaining a metal stack of wires above the substrate, and, e.g., electrically, connecting the embedded power and ground rails to a thicker backend metal in a stack or to bumps directly using TSV's or large and wide low resistive vias. This reduces the backend congestion and allows either for a wider width of metals for signals in a back-end-of-line (BEOL) stack or aid in shrinkage of the cell. Reduced congestion of metals may help in minimizing supply noise and parasitic coupling.

The proposed semiconductor device arrangement improves the ESD performance and reliability of a high-speed semiconductor device. The semiconductor device may be used in, e.g., electronic devices, automobiles, space, biotechnology, military, medical equipment etc.

The proposed semiconductor device arrangement involves selectively or fully moving a power grid from the BEOL to embed them in the substrate. The BEOL metals may be selectively used only for signal routing to minimize routing resistance of high speed signals. The proposed semiconductor device arrangement may create the power grid in a single level (e.g., bottoms of all rails may be coplanar with each other and tops of all rails may be coplanar with each other to define a single level layer) or two levels to improve the distribution efficiency. The metals that will be fabricated in the substrate may be optimized for improved resistance, e.g., as compared to existing routing, and may be connected directly to device terminals, e.g., thereby avoiding resistive lower end vias. The power grid embedded in the substrate may be optimized by trench depth for improved resistance as per current handling requirement. This power grid may also act as heat sink dissipating power and improving performance.

In the proposed semiconductor device, the metal grid embedded in the substrate may also form decoupling Metal insulator Metal (MIM) capacitors distributed in the proposed semiconductor device layout. These decoupling capacitors may have improved equivalent series resistance (ESR) as the proposed semiconductor device may have a reduced number of highly resistive low end stacks of the advanced nodes.

In the proposed semiconductor device, limitation of wire resistance may be solved by pushing the power grid below the devices, allowing wider metals for signals on top of devices as well as minimizing resistance in power grids. This may help advancement of Moore's law by overcoming limitations caused by high resistive wire load models for 5 nm and lower nodes.

The proposed semiconductor device arrangement constructs ESD devices with embedded ESD rails in the substrate. These metals may be used primarily for additional power grid layout for ESD devices. The embedded ESD rails in the substrate may be metals having higher width and thickness in order to minimize the resistance. The embedded ESD rails may be connected directly to the device terminals, e.g., instead of only through high resistive vias and metals in the stack. The thick ESD rails may be directly connected to top metals in the stack through an array of large vias or through TSV's, directly connecting to bumps on the top side, or onto micro bumps on the other side of a die. In either case, the proposed semiconductor device arrangement provides low resistive paths and reduces the pad voltage during an ESD event.

In the proposed semiconductor device, TSV technology or an array of large vias may be used to connect these metals, e.g., the thick power rails, directly to the device terminals and to the bottom grid. The ESD specific devices may be developed and characterized with these embedded ESD rails to improve the overall ESD performance.

In the proposed semiconductor device, implementing an embedded power grid, e.g., so power lines may be moved fully or partially from above the substrate into the substrate, may facilitate freeing the BEOL for signals with TSVs connecting the power grid to top bumps and/or bottom bumps (e.g., connectors). The metallization, e.g., metal rails in the power grid, may be formed with trenches having varying depths and widths to meet the design needs. The power grid may be formed as a single metal layer or a metal bilayer where a bottom grid is formed in a deep trench and a second layer is formed in shallow trench above the bottom grid.

In the proposed semiconductor device, decoupling capacitors may be formed using two stacked metal layers with a dielectric, e.g., $SiO_2$ or high-k dielectric, between the two stacked metal layers, e.g., between the top metal layer and the bottom metal layer. When such decoupling capacitors are distributed across the chip, e.g., when a decoupling capacitor is positioned at every intersection of the rails in the respective embedded stacked metal layers of the power grid, solid decoupling may be provided.

In the proposed semiconductor device, the decoupling capacitance may be formed in a single metal layer by placing VDD and VSS metal lines close to each other, while being separated by a dielectric, e.g., high-k dielectric or $SiO_2$, thereby forming fringing capacitances. The depth of the trench may give large capacitances. The decoupling capacitance may be increased by serpentining the VDD and VSS sandwiched region. In the proposed semiconductor device, the embedded power gid and associated decoupling formation may save backend space for better signal routing, better noise isolation, and reduction of cell area as per design need.

In the proposed semiconductor device, the power grid, i.e., the metal grid, may also act as a power dissipating heat sink, thereby improving the device performance. The metal fabricated, e.g., embedded, in the substrate may be optimized for improved resistance as needed in the design, e.g., a thickness of the metal rails along a direction normal to a bottom of the substrate may be controlled or adjusted to modify capacitance value and signal routing. For example, deeper trenches may provide thicker metal lines in the power grid within the substrate, while narrow/shallow trenches may provide for higher density of routing where devices are to be connected as needed in the design. In other words, the proposed semiconductor device take may implement the depth dimension and utilize it as the width.

In the proposed semiconductor device, the metal in the substrate may be directly connected to the device, thereby avoiding transitioning through multiple high resistive lower metal stack vias to reach the top or routing through high resistive lower back end and vias. The decoupling capacitors are formed as part of the power grid distributed along the grid, thereby improving the high speed designs. These decoupling capacitance may be obtained as part of the power grid itself without any additional area cost. By avoiding highly resistive vias stacks, the proposed semiconductor device may exhibit improved ESR for these capacitors.

The proposed semiconductor device frees the BEOL to have improved signal wires and so devices may operate faster. The method also enables further scaling of devices to lower technology nodes and promote the realization of Moore's law. Area saving may also be achieved as decoupling capacitors are now embedded. Supply noise coupling may be reduced as the power grid may now be better isolated from signals.

In the proposed semiconductor device, when the TSV connects to the strong and wide area of power grid, this may also be used as a heat sink for the heat generated in devices due to self-heat in lower nodes. Therefore, more heat may dissipate through wider power grid into the substrate, instead of signal routing on the top side of the devices. This may also improve the EM capability of metals used for signal routing as well as allow wider metal use for lower metal layers on the top side, in order to allow easier fix of signal EM violations in 4 nm and lower.

In an example, for low power/high speed interfaces in lower nodes, rail resistance expectation in the ESD path may be as low as 100 mΩ for high speed interfaces using core device drivers. The ESD currents may be in range of 1 A to 7.5 A. The scaling possesses significant challenges to ESD designs as a voltage drop in metallization itself may increase PAD voltage, thereby damaging the internal circuit. Putting a power metal stack with wider and thicker metallization directly under the devices may reduce the effective resistance in the ESD path and increase the margin for ESD designs.

In the proposed semiconductor device, another approach is to entirely use bottom power grid for Power/GND connection and then avoid coupling between Signal and power. Therefore, reducing PAD capacitance (caused by coupling) may also improve the circuit performance or use the additionally reduced PAD capacitance in adding more area to the primary ESD protection device in order to further improve ESD performance in High speed IP's.

Referring now to the drawings, and more particularly to FIGS. 1 through 16, where similar reference characters denote corresponding features consistently throughout the figures, example embodiments will be described.

FIG. 1 illustrates a power grid with a single metal layer embedded inside a substrate of a semiconductor device, according to example embodiments.

Referring to FIG. 1, a semiconductor device 100 may include a power grid 106 with a single metal layer that is embedded inside a substrate 104. For example, the semiconductor device 100 may be a fin field-effect transistor (FINFET), a Multi-Bridge-Channel FET (MBCFET), or the like.

As illustrated in FIG. 1, the power grid 106 with the single metal layer may be embedded inside the substrate 104. For example, as illustrated in FIG. 1, the power grid 106 may include a plurality of metal rails 202 horizontally spaced apart from each other, e.g., along the X-direction in parallel to a top surface of the substrate 104. For example, the metal rails 202 may be, e.g., linearly shaped, metal wirings that have bottoms that are coplanar with each other and tops that are coplanar with each other to define the single metal layer of the power grid 106. For example, the metal rails 202 may be arranged in parallel to each other, e.g., each of the metal rails 202 may be completely embedded within the substrate 104 to be surrounded by the material of the substrate. For example, as illustrated in FIG. 1, tops of the metal rails 202 may be vertically, e.g., along the Z-direction, spaced apart from a top of the substrate 104, such that the entirety of the power grid 106 may be embedded inside the substrate 104.

The single metal layer of the power grid 106 may also act as a heat sink taking away, e.g., dissipating, the heat to an external ambient, e.g., outside or exterior of the semiconductor device 100. In an embodiment, the single metal layer may have a high thickness, e.g., along the Z-direction, and may be fabricated in a deep trench 108 inside the substrate 104. For example, as illustrated in FIG. 1, the thickness of the single metal layer along the Z-direction may be larger than its width along the X-direction. A variable trench depth, e.g., along the Z-direction, and a variable trench width, e.g., along the X-direction, of each trench 108 may be used to adjust capacitance or other current handling requirements. For high density routing closer to the semiconductor device, the metal layer may be thinner to optimize an area layout.

As further illustrated in FIG. 1, voltage lines VSS and VDD may be embedded within the substrate 104. For example, the voltage lines VSS and VDD may include a power line **102*a* and a ground line 102*b*, e.g., each of the power line 102*a* and the ground line 102*b* may be, e.g., directly, connected to different ones of the metal rails 202**.

Figure 2:
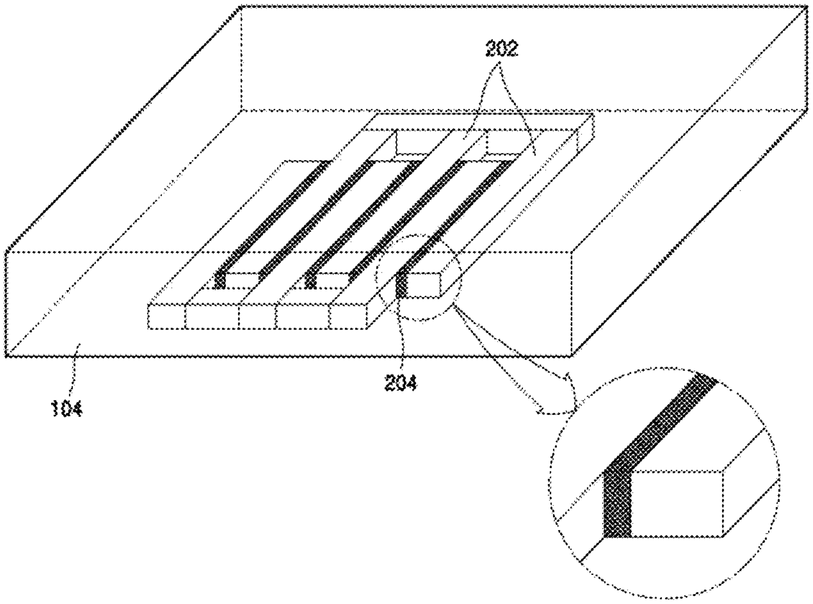
FIG. 2 is a schematic diagram of a deep trench single metal layer fringe capacitance part embedded inside a substrate, according to example embodiments.

FIG. 2 illustrates a capacitance part 204 embedded inside the substrate 104, according to example embodiments. It is noted that the metal rails 202 in FIG. 2 are the same as those of FIG. 1, with the exception of smaller distances therebetween to illustrate the structure of the capacitance part 204 in the power grid 106.

Referring to the FIG. 2, the capacitance part 204 may be a deep trench single layer, e.g., completely, embedded inside the substrate 104. The trench 108 depth may be increased to increase the capacitance in the capacitance part 204, e.g., a fringe capacitance part. The capacitance part 204 may be placed between metal rails 202, i.e., the metal rails 202 may be metal plates, so two metal rails 202 with the capacitance part 204 therebetween may define a capacitor, e.g., the capacitance part 204 may be a high-k dielectric material.

For example, in 4 nm nodes, self-heating may cause electromagnetic (EM) issues due to reduced current capability. Having a metal stack on a bottom of the power grid 106 within the substrate 104, e.g., rather than above the substrate 104, may improve dissipation of heat into the substrate 104 as well as minimize the heat conducted into the metals, e.g., wires, carrying signals which are on the top side of the devices, e.g., above the substrate 104. In other words, the metal stack, e.g., the metal rails 202, for the power grid 106 buried, e.g., embedded, in or on top of the substrate 104 may also act as an efficient heat sink.

Figure 3:
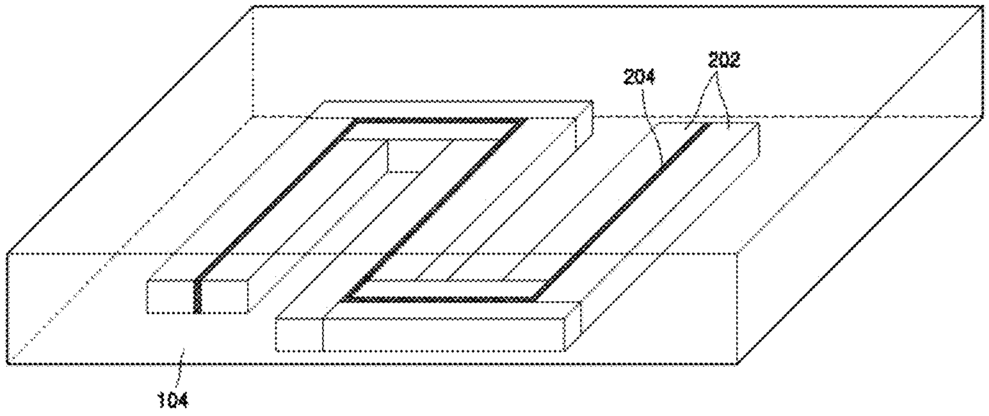
FIG. 3 is a schematic diagram of a deep trench serpentine fringe capacitance part embedded below a substrate, according to example embodiments.

FIG. 3 illustrates the deep trench serpentine fringe capacitance part 204 embedded below the substrate 104, according to example embodiments. It is noted that the capacitance part 204 in FIG. 3 may be similar to the capacitance part 204 of FIG. 2, with the exception of its shape, e.g., in a top view.

Referring to FIG. 3, the capacitance part 204 may be a deep trench having a serpentine shape embedded below the substrate 104, as previously described with reference to the capacitance part 204 in FIG. 2. For example, as illustrated in FIG. 3, the metal rails 202 may be serpentine shaped in a top view, and may be conformal with each other with the capacitance part 204 therebetween. For example, the capacitance part 204 may be used where a space is of concern and metal may be routed.

Figure 4:
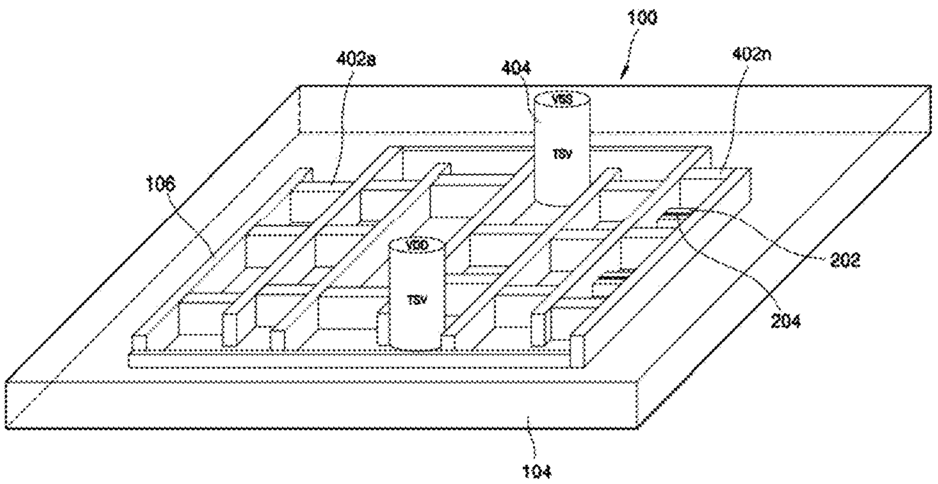
FIG. 4 is a schematic diagram of through-silicon vias (TSVs) and large vias that connect a power grid to both sides/top side of a semiconductor package, according to example embodiments.

FIG. 4 illustrates through-silicon vias (TSVs) connected to the power grid 106, according to example embodiments.

Referring to the FIG. 4, the power grid 106 with the single metal layer may be embedded inside the substrate 104, as discussed previously with reference to FIG. 1. The single metal layer may also act as a heat sink taking away the heat to an external ambient. In an embodiment, the single metal layer with high thickness may be fabricated in the deep trench 108 inside the substrate 104.

Further, as illustrated in FIG. 4, TSVs 404 may be connected to the power grid 106 at both sides of a package, e.g., the TSVs 404 may be connected to opposite sides of the power grid 106 at a top side of the power grid 106. For example, the TSVs 404 may electrically connected the power grid 106 to devices above the substrate 104. The capacitance part 204, e.g., a decoupling capacitance part, may be distributed in the power grid 106. For example, the capacitance part 204 between two adjacent metal rails 202 may be distributed within the power grid 106, e.g., between portions of the power grid 106.

Further, the semiconductor device 100 may also use combination of BEOL/vias stack and the power grid 106 with the single metal layer embedded inside the substrate 104 to optimize routing. For example, at least one standard cell 402, e.g., a plurality of standard cells (402*a*-402*n*), may be placed in the power grid 106, e.g., inside or above the substrate 104. The standard cell 402 may include at least one of a diode, a P-channel metal-oxide semiconductor (PMOS) transistor, an N-channel metal-oxide semiconductor (NMOS) transistor, and a resistor.

Figure 5:
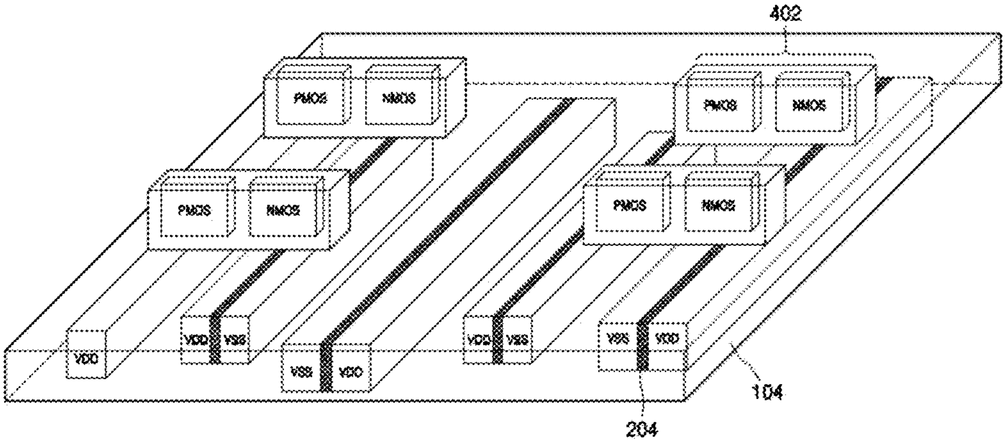
FIG. 5 is a schematic diagram of a decoupling capacitance formation between power rails in a standard cell layout, according to example embodiments.

FIG. 5 illustrates a decoupling capacitance formation between power rails in a standard cell layout, according to example embodiments.

Referring to FIG. 5, the capacitance part 204, i.e., a power rail capacitance part, may be sandwiched in spaces in the power grid 106. For example, the capacitance part 204 may be sandwiched between a power line (e.g., VDD) and a ground line (e.g., VSS) in the power grid 106 embedded in the substrate to define a decoupling capacitor.

Figure 6:
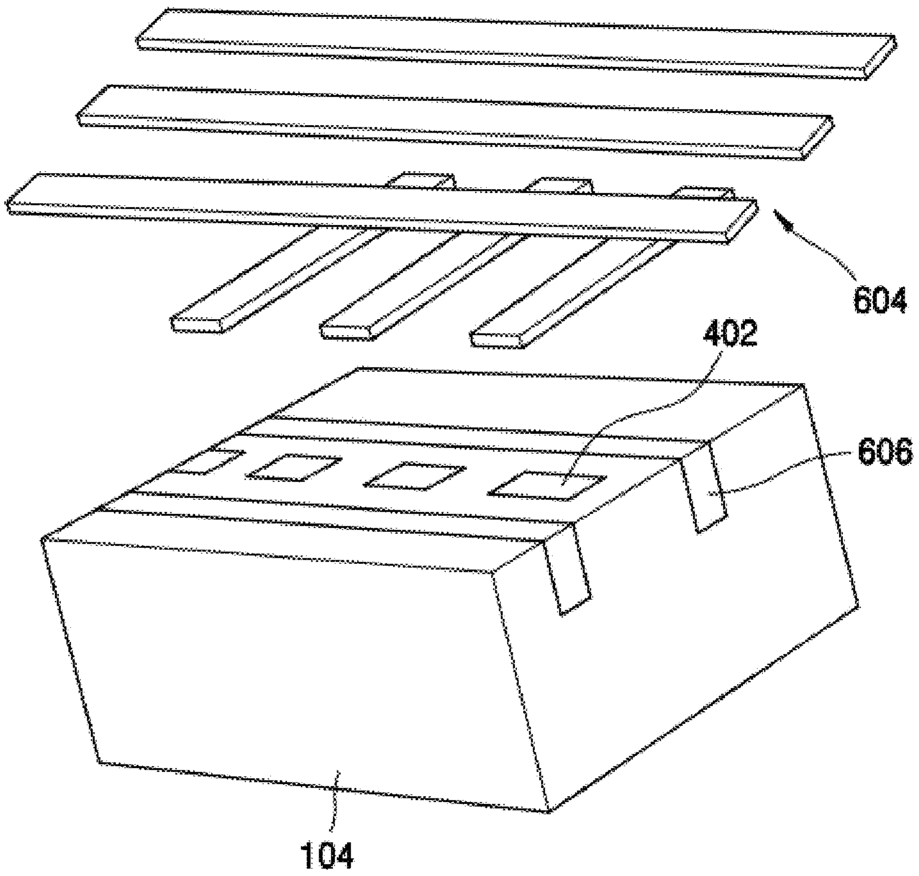
FIG. 6 and FIG. 7 are schematic diagrams of a power grid with a single metal layer embedded inside a substrate, according to example embodiments.
Figure 7:
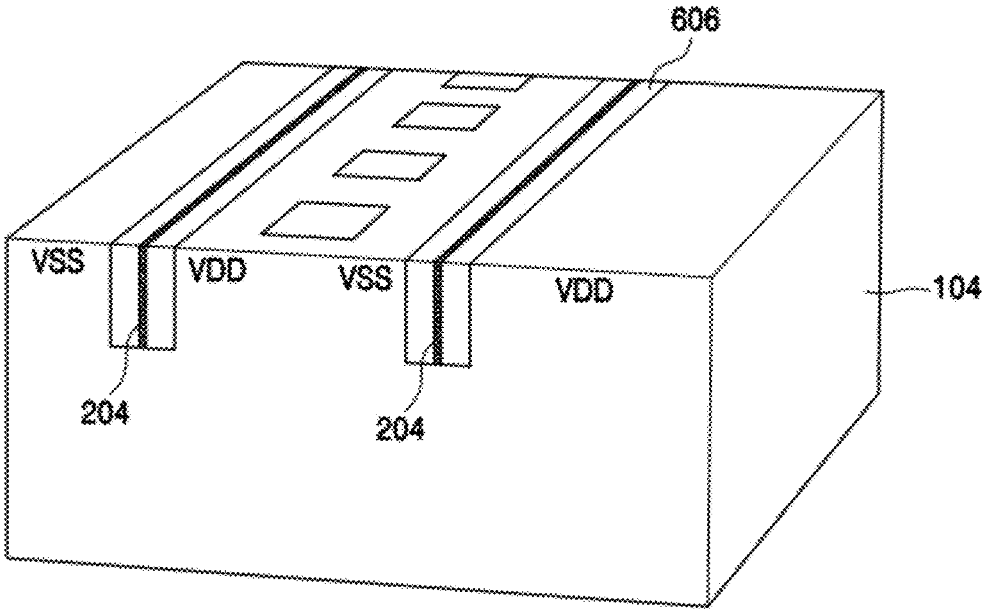

FIG. 6 and FIG. 7 illustrate a power grid with a single metal layer embedded inside a substrate, according to other example embodiments. The power grid in FIGS. 6 and 7 may be a power distribution network (PDN) layer 606.

Referring to FIG. 6, the standard cell 402, e.g., an active standard cell, may be placed on, e.g., embedded within, the substrate 104 between, e.g., portions of, at least one single layer of the PDN layer 606. The at least one single layer of the PDN layer 606 may be embedded inside the substrate 104. The at least one single layer of the PDN layer 606 may include a power line, a ground line, and a high-k dielectric part between the power line and the ground line. BEOL metal layers 604 may be placed on the substrate 104, e.g., to be electrically connected to the PDN layer 606.

Referring to the FIG. 7, the standard cell 402 may be placed on, e.g., embedded within, the substrate 104 between portions of the at least one single layer of the PDN layer 606. The at least one single layer of the PDN layer 606 may be embedded inside the substrate 104. The at least one embedded PDN single layer 606 may include a power line (e.g., VDD), a ground line (e.g., VSS), and a high-k dielectric part (e.g., the capacitance part 204) between the power line and the ground.

Figure 8:
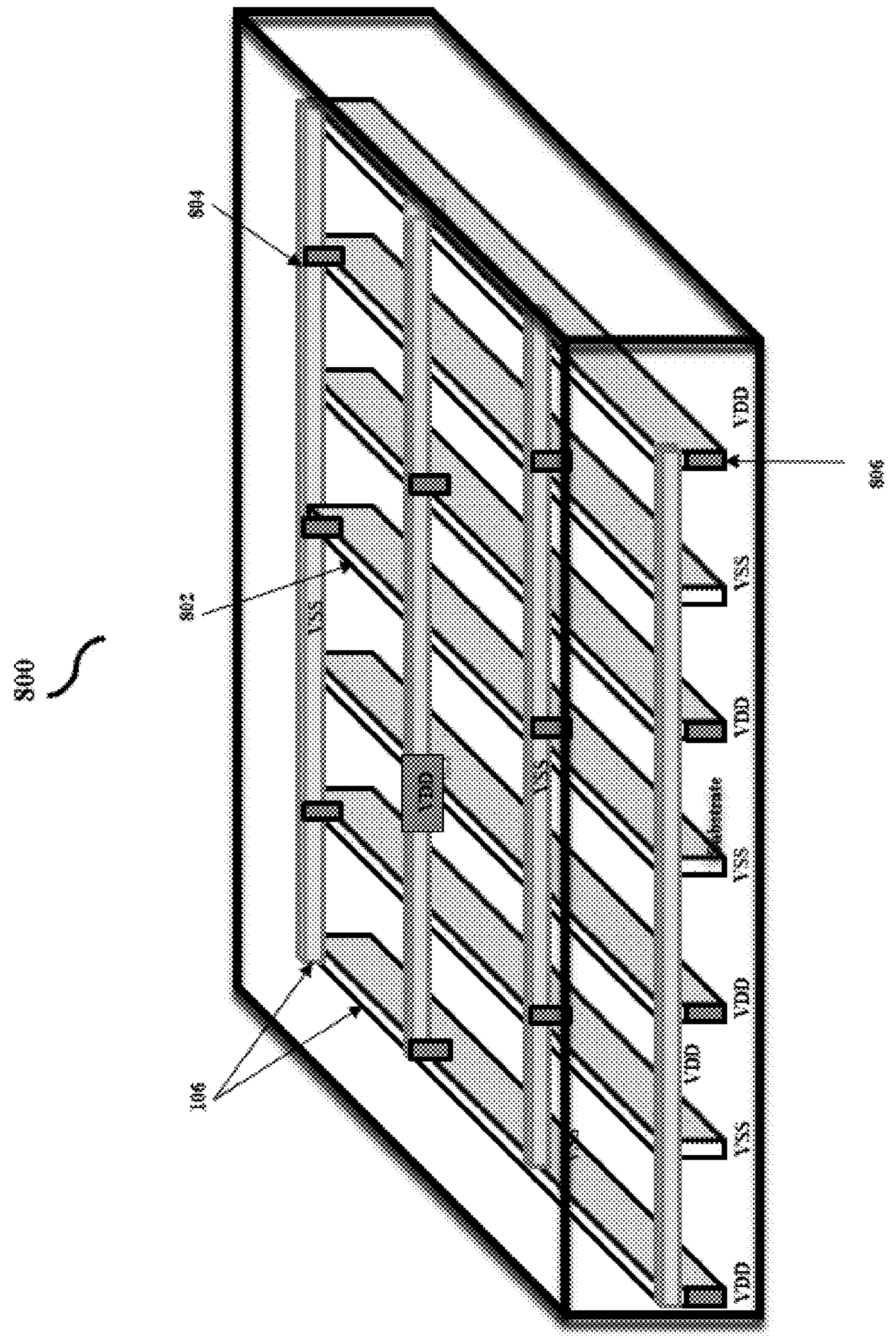
FIG. 8 is a schematic diagram of a power mesh with two metal levels embedded inside a substrate, according to example embodiments.

FIG. 8 illustrates a power grid with two metal levels embedded inside a substrate, according to other example embodiments.

Referring to FIG. 8, the power grid 106 may include two metal levels, i.e., a double metal layer, embedded inside the substrate 104. The double metal layer may also act as a heat sink taking away, e.g., dissipating, heat to an external ambient.

The power grid 106 may include a first metal layer 802 embedded in a deep trench inside the substrate 104, and a second metal layer 804 embedded in a shallow trench above the first metal layer 802. For example, as illustrated in FIG. 8, the second metal layer 804 may be between the top of the substrate 104 and the first metal layer 802. For example, as further illustrated in FIG. 8, the thickness of the second metal layer 804 may be less than the thickness of the first metal layer 802, e.g., the first metal layer 802 may include power lines (e.g., VDD) and ground lines (e.g., VSS).

For example, as illustrated in FIG. 8, the second metal layer 804 may intersect the first metal layer 802 to form a power mesh, e.g., a double-layered grid of intersecting metal rails. Further, vias 806 may be formed between the first metal layer 802 and the second metal layer 804 in the power grid 106, e.g., to electrically connected the first and second metal layers 802 and 804.

Figure 9:
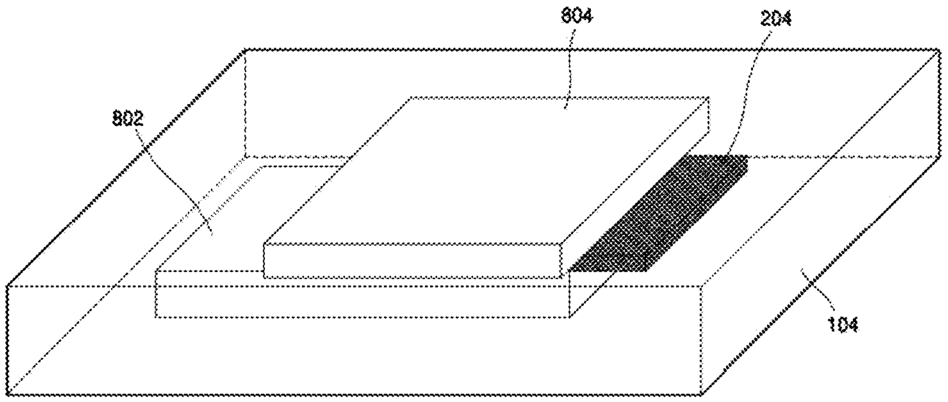
FIG. 9 is a schematic diagram of a parallel plate metal capacitance below a substrate in two metal levels embedded in substrate, according to example embodiments.

FIG. 9 illustrates a parallel plate metal capacitor within a substrate in two level metal embedded in the substrate, according to example embodiments.

Referring to the FIG. 9, the first metal layer 802 may be embedded in the deep trench inside the substrate 104, and the second metal layer 804 may be embedded in the shallow trench above the first metal layer 802, as described previously with reference to FIG. 9. For example, the first and second metal layers 802 and 804 may both be completely embedded within the substrate 104. The capacitance part 204, e.g., a high-k dielectric material, may be formed between the first metal layer 802 and the second metal layer 804 in the power grid.

For example, referring to FIG. 9, an area of the capacitance part 204 may equal an overlap area between the first metal layer 802 and the second metal layer 804, e.g., the capacitance part 204 may completely cover the overlap area between metal rails of the first metal layer 802 and metal rails of the second metal layer 804. For example, the configurations of the e.g., metal rails of the first metal layer 802 and the second metal layer 804 may include any of solid fill, slotted, stripped, etc., as per manufacturing rule.

Figure 10:
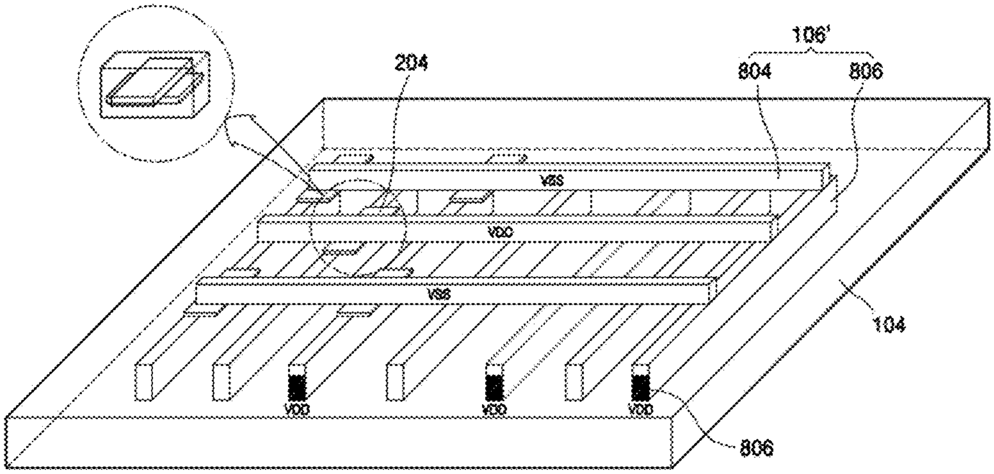
FIG. 10 is a schematic diagram of a parallel plate metal capacitance used as decoupling capacitance below a substrate in two metal levels embedded in a substrate, according to example embodiments.

FIG. 10 illustrates a parallel plate metal capacitor used as a decoupling capacitor within a substrate in two level metal embedded in the substrate, according to example embodiments.

Referring to FIG. 10, the first metal layer 802 may be embedded in the deep trench inside the substrate 104, and the second metal layer 804 may be embedded in the shallow trench above the first metal layer 802. For example, the first and second metal layers 802 and 804 may both be completely embedded within the substrate 104. The capacitance part 204, e.g., a high-k dielectric material, may be formed between the first metal layer 802 and the second metal layer 804 in the power grid, e.g., between overlapping portions of the first and second metal layers 802 and 804 within the power grid. The capacitance, e.g., the capacitor, may be formed and distributed across the power grid, as part of the power grid itself. Additional decoupling capacitances may be formed between the VDD, e.g., a supply voltage line, and the VSS, e.g., a ground line. For example, the substrate 104 may be used as the VSS.

Figure 11:
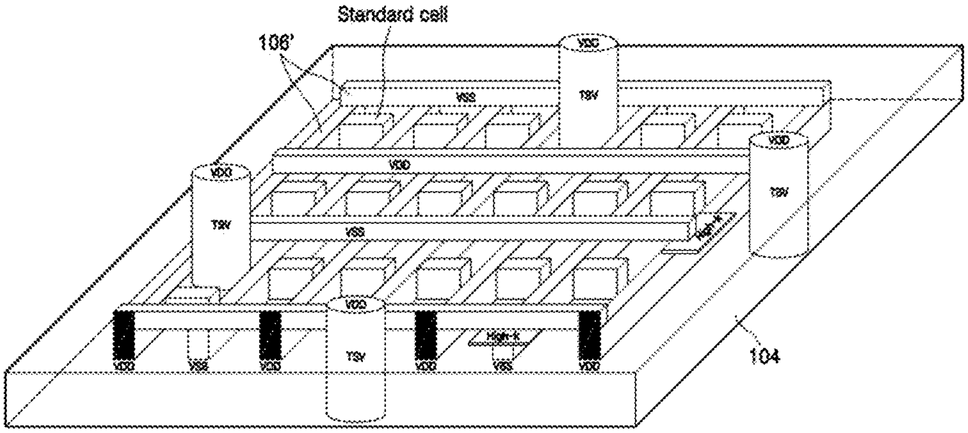
FIG. 11 to FIG. 13 are schematic diagrams of a power grid with a double metal layer embedded inside a substrate, according to example embodiments.
Figure 12:
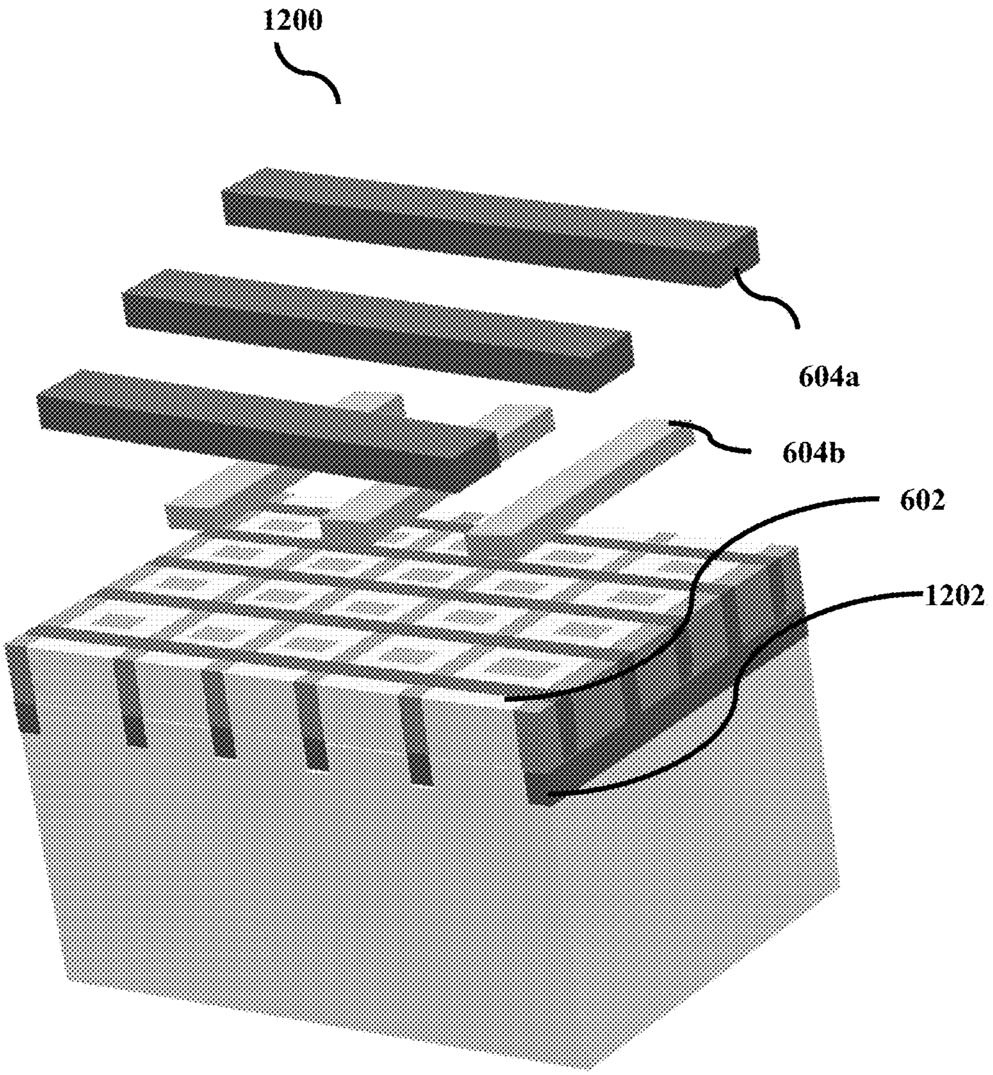
Figure 13:
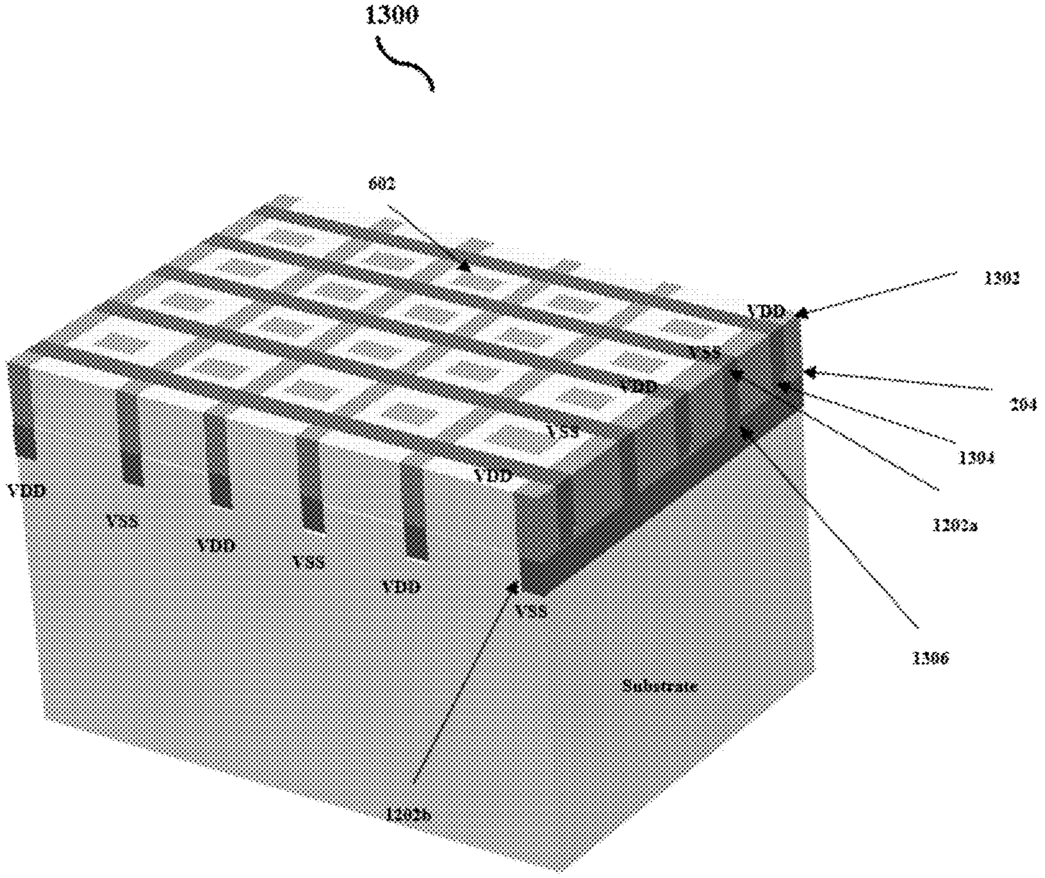

FIG. 11 to FIG. 13 illustrate a power grid with a double metal layer embedded inside the substrate 104, according to other example embodiments.

Referring to the FIG. 11, the power grid 106 described previously with reference to FIG. 8 may further include TSVs connected to the power grid 106, e.g., four TSVs may be connected at four respective sides of the power grid 106. The capacitance part 204, e.g., a decoupling capacitance part, may be positioned between overlapping portions of the first and second metal layers of the power grid 106, e.g., as described previously with reference to FIGS. 9 and 10. A plurality of standard cells may be placed in the power grid 106.

Referring to the FIG. 12, in a semiconductor device 1200, the standard cell 402 may be placed on, e.g., embedded within, the substrate 104 between portions of a PDN bilayer 1202. The PDN bilayer 1202 may be embedded inside the substrate 104. The PDN bilayer 1202 may include a power line, a ground line, and a high-k dielectric part between the power line and the ground. The PDN bilayer 1202 may include the first and second metal layers, as discussed previously with reference to FIGS. 8-10. The BEOL metal layers 604*a* and 604*b* may be placed on the substrate 104.

Referring to the FIG. 13, in a semiconductor device 1300, a standard cell 602 may be placed on, e.g., embedded within, the substrate 104 between portions of a PDN bilayer. The PDN bilayer may include a top embedded PDN bilayer 1202*a* and a bottom embedded PDN bilayer 1202*b*.

In detail, the top and bottom embedded PDN bilayers 1202*a* and 1202*b* is may be embedded inside the substrate 104. The PDN bilayer may include a power line, a ground line, and a high-k dielectric part, e.g., the capacitance part 204, between the power line and the ground line. The BEOL metal layers may be placed on the substrate 104 (or may be omitted). Same type top and bottom metal layers may be shorted at 1306. Further, an oxide filling 1304 may fill a remaining portion of the deep trench part.

Figure 14:
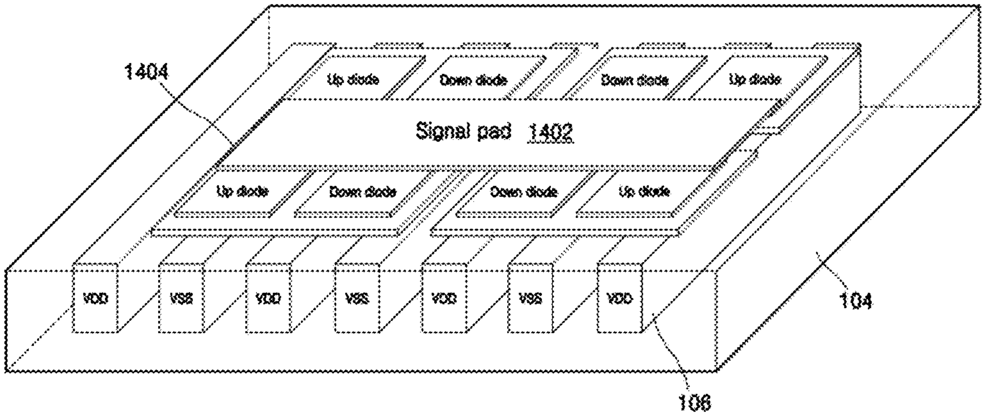
FIG. 14 is a schematic diagram of ESD clamps with a power grid embedded inside a substrate, according to example embodiments.

FIG. 14 illustrates electrostatic discharge (ESD) clamps in a power grid embedded inside the substrate 104, according to example embodiments.

Referring to FIG. 14, the power grid 106 may be embedded inside the substrate 104, e.g., the power grid 106 may include power lines VSS and VDD. For example, the metal rails of the power grid 106 may include metal with a high thickness. Further, the thick metal rails in the power grid 106 may be connect to the ESD devices directly, thereby reducing the resistance contributed by lower metals and via stack. Up and down diodes 1404 may be placed over the power grid 106, and a signal pad 1402 may be placed over the power grid 106.

Figure 15:
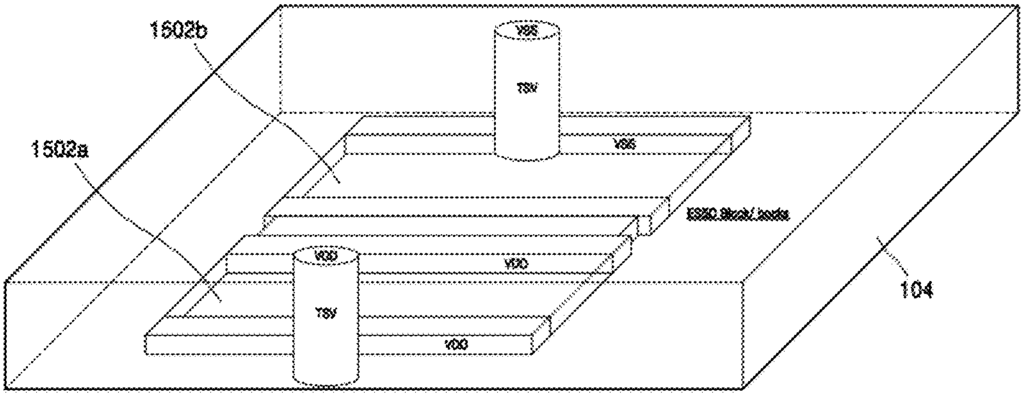
FIG. 15 is a schematic diagram of an interconnection to top or bottom using trench vias or TSVs, according to example embodiments.

FIG. 15 illustrates an interconnection to top or bottom using a trench via or the TSVs 404, according to example embodiments.

Referring to the FIG. 15, ESD deep trench power lines may be embedded in the substrate 104. Large metals may be configured as, e.g., solid fill, meshed, or slotted, as per the manufacturing rule to reduce resistivity. One or more dedicated paths (1502*a* and 1502*b*) may be used for discharge and improve the ESD performance. Using TSVs or trench vias directly from the top of the package or the bottom of the package may improve the via path resistivity. In an embodiment, the power grid connection may be with the TSV to both sides of the package, to top sides of the package, or through the vias to the top power metals.

Figure 16:
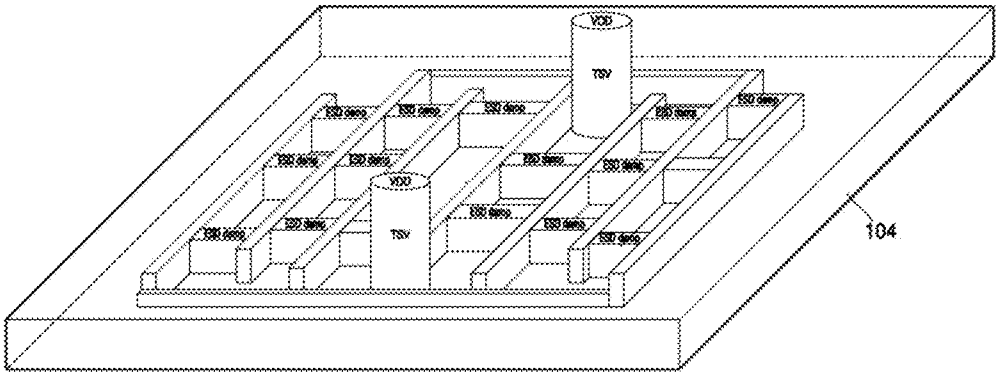
FIG. 16 is a schematic diagram of TSVs that connect an ESD power grid to both sides of a package, according to example embodiments.

FIG. 16 illustrates the TSVs connected to an ESD power grid at both sides of the package, according to example embodiments. Referring to FIG. 16, the ESD deep trench power lines may be embedded inside the substrate 104. Large metals may be implemented as, e.g., solid fill, meshed, or slotted configurations, as per the manufacturing rule to reduce resistivity. The TSVs may connect the power grid to both sides of the package.

By way of summation and review, a metal stack and high resistive vias connecting the semiconductor devices to package pins may contribute a significant resistance, thereby increasing the resistance of the entire ESD path. In all lower nodes, resistance of metals in the ESD path may significantly limit the ESD performance of the chips, thereby reducing reliability.

For example, high speed interfaces in 7 nm and below use core devices for driver design which has lower breakdown voltages. Along with minimum PAD capacitance requirement, which reduces the ESD device area and increases rail resistance, it may impact the ESD design margins. A significant voltage drop seen in the PAD is mainly due to higher voltage drop from highly resistive metal stacks in lower nodes, thereby affecting ESD performance of circuits in high speed IP design. With another metal stack embedded in the substrate, it allows for low resistive path for ESD current to dissipate.

In the VLSI, semiconductor device scaling has enabled fabrication of high speed devices and has reduced the area on the chip. This has also reduced the width and thickness of metal wires and vias used for a power grid, thereby increasing the resistance of the power grid, e.g., at lower back end metal and vias. In advanced nodes, congestion of metal layers in a layout has increased due to signal and power routing, thereby increasing the parasitic and noise coupling between power and critical signals, which has become a bottle-neck for high-speed designs. As a result, the number of metals, e.g., metals wires and contacts, used in the metal stack has also increased.

An aspect of example embodiments is to provide a semiconductor device with improved ESD performance and reliability. That is, the ESD performance is improved by directly connecting to low resistive metal rails embedded in a substrate and using a substrate embedded power grid approach with integrated distributed decoupling capacitances for high signal integrity and high density routing for Power Performance Area (PPA) benefit in advanced nodes of the semiconductor device.

An aspect of example embodiments is also to reduce resistance of an entire metal stack from a top metal in a metal stack to metals connecting the semiconductor devices. The proposed semiconductor device improves the ESD performance of chips by reducing the resistance in the ESD path.

Another aspect of example embodiment is to optimize an entire metal stack by selectively or fully moving entire power and ground rails embedded in the substrate and connecting to thicker backend metal in a stack or to bumps directly using TSV's or large and wide low resistive vias. This reduces the backend congestion and allows either for a wider width of metals for signals in a BEOL stack or aid in shrinkage of the cell. Reduced congestion of metals may help in minimizing supply noise and parasitic coupling.

Another aspect of example embodiment is to integrate the power grid with the substrate embedded decoupling capacitors formed as part of the embedded power grid itself distributed in the grid. This will improve the Equivalent Series resistance (ESR) of the decoupling capacitors by avoiding resistive via stacks. Thus, improving the performance of high speed designs. This will also provide area saving as the proposed semiconductor device may free the back end of most of the decoupling capacitors.

Another aspect of example embodiment is to improve the performance of high speed IP designs and help the Moore's law advance further by overcoming the limitation of wire load models in 5 nm and lower.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

an electrostatic discharge (ESD) device including a diode and configured to control an electrostatic discharge in the semiconductor device;

a plurality of metal rails embedded within the substrate; and a power grid embedded within the substrate, at least one of the plurality of metal rails being part of the power grid and being directly connected to the ESD device, wherein the plurality of metal rails are buried in the substrate below a top surface of the substrate, and wherein the ESD device is disposed on and overlaps a buried portion of the power grid in a direction perpendicular to the top surface of the substrate.

2. The semiconductor device as claimed in claim 1, wherein at least one of the plurality of metal rails is a heat sink in the semiconductor device.

3. The semiconductor device as claimed in claim 1, further comprising at least one trench embedded in the substrate, the at least one of the plurality of metal rails being embedded in the at least one trench.

4. The semiconductor device as claimed in claim 3, wherein a thickness of the at least one trench is larger than a width of the at least one trench.

5. The semiconductor device as claimed in claim 3, wherein a depth of the at least one trench is controlled to modify a capacitance value in the semiconductor device.

6. The semiconductor device as claimed in claim 1, further comprising at least one decoupling capacitance part integrated with at least two of the plurality of metal rails in the power grid to provide a high signal integrity and high density routing.

7. The semiconductor device as claimed in claim 1, further comprising at least one decoupling capacitance part between adjacent ones of the plurality of metal rails, the at least one decoupling capacitance part being embedded inside the substrate.

8. The semiconductor device as claimed in claim 1, further comprising:

at least two through-silicon vias (TSVs) connected with the power grid at two sides of the semiconductor device;

at least one decoupling capacitance part in the power grid, the at least one decoupling capacitance part being embedded in the substrate between power lines; and a standard cell on at least one of the power lines.

9. The semiconductor device as claimed in claim 8, wherein the at least two TSVs are between the plurality of metal rails in the power grid.

10. The semiconductor device as claimed in claim 1, further comprising:

at least one decoupling capacitance part between a power line and a ground line in the power grid; and a standard cell on the power line.

11. The semiconductor device as claimed in claim 10, wherein the at least one decoupling capacitance part includes a high-k dielectric part, the high-k dielectric part being between the power line and the ground line and defining a capacitor.

12. The semiconductor device as claimed in claim 10, wherein the standard cell includes at least one of a diode, a P-channel metal-oxide semiconductor (PMOS) transistor, an N-channel metal-oxide semiconductor (NMOS) transistor, and a resistor.

13. The semiconductor device as claimed in claim 1, wherein the plurality of metal rails includes:

a first metal rail, the first metal rail being part of the power grid and embedded in a deep trench inside the substrate;

a second metal rail, the second metal rail being part of the power grid and embedded in a shallow trench above the first metal rail; and at least one via between the first metal rail and the second metal rail in the power grid.

14. The semiconductor device as claimed in claim 1, wherein the plurality of metal rails includes:

a first metal rail, the first metal rail being part of the power grid and embedded in a deep trench inside the substrate;

a second metal rail, the second metal rail being part of the power grid and embedded in a shallow trench above the first metal rail; and a high-k dielectric part between the first metal rail and the second metal rail in the power grid.

15. A semiconductor device, comprising:

a substrate;

at least one Power Distribution Network (PDN) layer embedded within the substrate, the at least one PDN layer being a single layer and including a power line, a ground line, and a high-k dielectric part between the power line and the ground line; and a standard cell embedded within the substrate, the standard cell disposed on and overlapping a portion of the at least one PDN layer in a direction perpendicular to a top surface of the substrate, wherein the power line, the ground line, the high-k dielectric part, and the portions of the at least one PDN layer are embedded within the substrate to be surrounded by material of the substrate.

16. The semiconductor device as claimed in claim 15, further comprising back-end-of-line layers on the substrate.

17. The semiconductor device as claimed in claim 15, wherein the standard cell includes at least one of a diode, a P-channel metal-oxide semiconductor (PMOS) transistor, an N-channel metal-oxide semiconductor (NMOS) transistor, and a resistor.

18. A semiconductor device, comprising:

a substrate;

at least one top Power Distribution Network (PDN) layer embedded within the substrate, the at least one top PDN layer including a first power line, a first ground line, and a first high-k dielectric part between the first power line and the first ground line;

at least one bottom PDN layer embedded within the substrate, the at least one bottom PDN layer including a second power line, a second ground line, and a second high-k dielectric part between the second power line and the second ground line; and at least one standard cell embedded within the substrate, the at least one standard cell disposed on and overlapping a portion of the at least one top PDN layer in a direction perpendicular to a top surface of the substrate, wherein the first and second power lines, the first and second ground lines, and the portions of the at least one top PDN layer are embedded within the substrate to be surrounded by material of the substrate.

19. The semiconductor device as claimed in claim 18, further comprising back-end-of-line layers on the substrate.

20. The semiconductor device as claimed in claim 18, wherein the at least one standard cell includes at least one of a diode, a P-channel metal-oxide semiconductor (PMOS) transistor, an N-channel metal-oxide semiconductor (NMOS) transistor, and a resistor.

* * * * *